(12) United States Patent
Master et al.

(10) Patent No.: US 6,258,612 B1
(45) Date of Patent: Jul. 10, 2001

(54) DETERMINATION OF FLUX PRIOR TO PACKAGE ASSEMBLY

(75) Inventors: Raj N. Master; Jonathan D. Halderman, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/642,832

(22) Filed: Aug. 22, 2000

Related U.S. Application Data
(60) Provisional application No. 60/214,149, filed on Jun. 28, 2000.

(51) Int. Cl.[7] .......................... H01L 21/66; H01L 21/00; G01R 31/26
(52) U.S. Cl. ..................... 438/15; 438/5; 438/7; 438/14; 438/16; 73/290 R; 73/293; 73/314; 73/327; 73/427; 148/508; 148/510; 33/DIG. 4; 356/28.5
(58) Field of Search ................. 438/5, 7, 14–16; 73/290 R, 293, 314, 327, 427; 148/508, 510; 33/DIG. 4; 356/28.5

(56) References Cited

U.S. PATENT DOCUMENTS

| | | | |
|---|---|---|---|
| 4,276,186 | 6/1981 | Bakos et al. | 252/158 |
| 4,880,971 | * 11/1989 | Danisch | 250/227 |
| 5,922,606 | 7/1999 | Jenkins et al. | 436/55 |
| 5,932,021 | 8/1999 | Cala et al. | 134/2 |
| 5,988,485 | 11/1999 | Master et al. | 228/180.22 |
| 6,039,805 | 3/2000 | Davis et al. | 118/74 |
| 6,059,894 | 5/2000 | Pendse | 148/23 |
| 6,121,062 | * 9/2000 | Karasawa et al. | 438/15 |

* cited by examiner

Primary Examiner—John F. Niebling
Assistant Examiner—David A Zarneke

(57) ABSTRACT

A package assembly is formed by applying flux to a device and/or a substrate and inspecting the applied flux to determine whether the amount applied is within a predetermined range. Embodiments include applying a rosin based flux on a laminate substrate and measuring the thickness of the applied flux with an interferometer.

13 Claims, 4 Drawing Sheets

DETERMINATION OF FLUX PRIOR TO PACKAGE ASSEMBLY

RELATED APPLICATION

This application claims priority from U.S. Provisional Application Ser. No. 60/214,149 filed Jun. 28, 2000, entitled "Determination of Flux Prior to Package Assembly", which is hereby incorporated in its entirety by reference herein.

FIELD OF THE INVENTION

The present invention relates generally to semiconductor packaging technology and the manufacture of package assemblies. The present invention has particular applicability to methods of determining the amount of flux applied to a substrate or semiconductor device in the manufacture of a semiconductor package.

BACKGROUND

Integrated circuit devices are typically electronically packaged by mounting one or more integrated circuit (IC) chips or dies to a substrate, sometimes referred to as a carrier. In a flip chip assembly or package, the die is "bumped" with solder to form a plurality of discrete solder balls over metal contacts on the surface of the die. The chip is then turned upside down or "flipped" so that the device side or face of the IC die can be mounted to a substrate having a corresponding array of metal contacts. Typically, the metal contacts of the substrate are coated with a solder alloy. Electrical interconnection of the die to the substrate is conventionally performed by aligning the die to the substrate and reflowing the solder on the die and/or the substrate to electrically and mechanically join the parts. Directly coupling the die immediately below the substrate allows for an increased number of interconnections and improves voltage noise margins and signal speed.

Typically, a flux composition is applied to either the die or the substrate to facilitate the formation of the interconnect. Flux acts as an adhesive to hold the placed components in place pending soldering and further acts to minimize metallic oxidation that occurs at soldering temperatures thereby improving the electrical and mechanical interconnection and reliability between the soldered component and substrate.

Soldering fluxes fall into three broad categories: rosin fluxes, water-soluble fluxes, and no-clean fluxes. Rosin fluxes, which have a relatively long history of use and are still widely used in the electronics industry. Water-soluble fluxes, which are a more recent development and which are increasingly used in consumer electronics, are highly corrosive materials. No-clean fluxes, a very recent development, reportedly do not require removal from the circuit assemblies. The most common flux for IC die attach packaging comprises a suspension liquid of various acids suspended in an alcohol base.

It has been observed that controlling the amount of applied flux is important irrespective of the type of flux employed in a particular packaging process, since enough flux must be used to effect a reliable metallurgical bond to electrically and mechanically interconnect the component to the substrate. Too much applied flux, however, can undesirably cause displacement of the placed component due to flux boiling. Excess flux further adversely impacts other circuit board manufacturing processes. For example, traces of the soldering flux residues which remain after solder reflow can lead to circuit failure, delamination of underfill, etc.

Accordingly, a continual need exists for improved processes and/or assemblies for the packaging of electronic components on to substrates employing solder fluxes.

SUMMARY OF THE INVENTION

An advantage of the present invention is a high yield, high through-put process for inspecting the application of flux during assembly of a device package.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of monitoring flux application. The method comprises applying flux to a substrate and/or a semiconductor device to coat either or both parts with flux, i.e. to form a thin film of the flux on the part. Once the flux has been applied to the part, it is monitored to determine the amount applied, e.g. the thickness of applied flux is determined.

Embodiments of the present invention include applying a rosin flux to a solder alloy on an organic or ceramic substrate and monitoring the thickness of the applied flux by impinging a light on the flux film and detecting the reflected light. The impinging light can be that of a laser, e.g. a He—Ne laser, and the detector can be a photodetector or a photomultiplier tube as, for example, in an interferometer.

Another aspect of the present invention is a method of manufacturing an interconnected device assembly. The method comprises: providing a substrate having conductive contacts thereon for mounting a device, providing a device having a plurality of solder contacts thereon, e.g. solder bumps; applying a film of flux to the substrate and/or the device; monitoring the thickness of the applied flux; mounting the device on the substrate such that the solder contacts of the device are aligned with the conductive contacts on the substrate to form a substrate/device assembly; and forming an electrical connection between the solder contacts of the device and the conductive contacts on the substrate.

By monitoring the thickness of the applied flux prior to assembling the device and substrate, the present invention advantageously provides an in-situ method for optimally determining the uniformity and amount of flux applied to a particular packaging assembly thereby minimizing waste.

Embodiments of the present invention include mounting the device to the substrate in response to monitoring the thickness of the applied flux above a predetermined thickness value, e.g. monitoring the thickness above 5 mils, or cleaning and re-applying flux to the substrate and/or the device in response to the thickness being below a predetermined value, e.g. below 0.05 mils.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

BRIEF DESCRIPTION OF THE DRAWINGS

The various features and advantages of the present invention will become more apparent as a detailed description of the embodiments thereof is given with reference to the appended figure described below.

DESCRIPTION OF THE INVENTION

The present invention addresses and solves the problem of random and systematic variations, in the uniformity, coverage and amount of flux applied to a device and/or substrate caused by variations in flux composition, fluctuations in process parameters, varied pattern densities, etc. by a non-contact monitoring technique preformed prior to assembly of the device and substrate. The present invention enables the manufacture of semiconductor packages, particularly flip chip semiconductor devices having solder bumps, with improved process control over the application of flux. The present invention advantageously enables in-situ process control and closed-loop control over the fluxing procedure during packaging of a semiconductor device.

Figure 1:
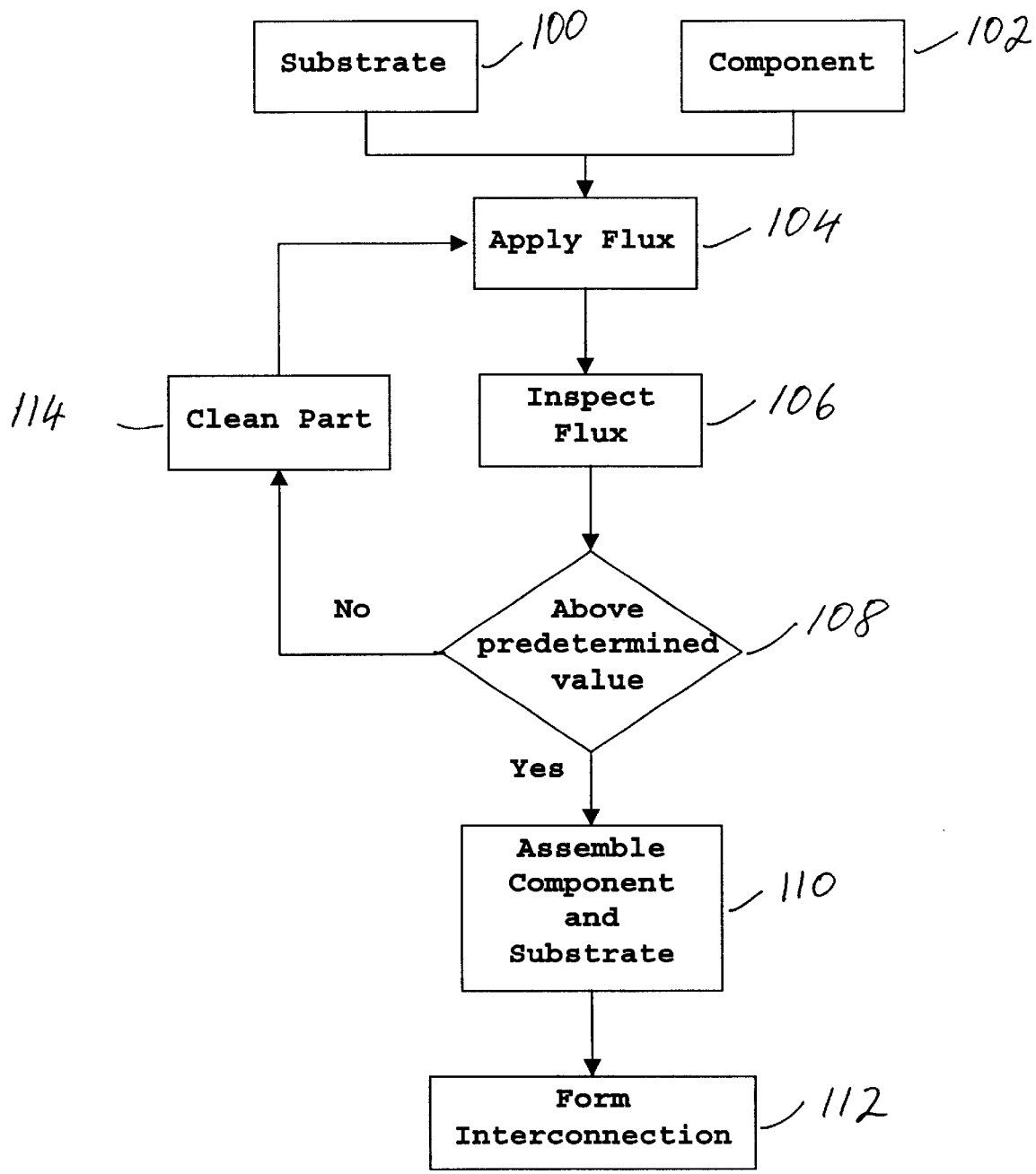
FIG. 1 shows a flow chart of packaging a device in accordance with the present invention.

The various features and advantages of the present invention will become more apparent by reference to the drawings. As illustrated in FIG. 1, a method of assembling an integrated device, e.g. a IC die, and a substrate in a flip chip configuration in accordance with the present invention begins with Step 100 by providing a substrate for mounting a device. The substrate has an array of conducive contacts corresponding to the solder bumps of the device to be mounted and joined thereto and can be made of ceramic or organic materials.

In an embodiment of the present invention, the substrate is constructed of a plurality of laminated dielectric and conductive layers where individual IC chips are mounted to the top layer of the substrate. A pre-defined metallization pattern lies on each dielectric layer within the substrate. Metallization patterns on certain layers act as voltage reference planes and also provide power to the individual chips. Metallization patterns on other layers route signals between individual chips. Electrical connections to individual terminals of each chip and/or between separate layers are made through well-known vertical interconnects called "vias". Interconnect pins are bonded to metallic pads situated on the face of the substrate and are thereby connected to appropriate metallization patterns existing within the substrate. These interconnect pins route electrical signals between a multi-chip integrated circuit package and external devices. The array of conductive contacts on the face of the substrate can be coated with solder alloy to form bond pads or solder bumps corresponding to a particular device. Alternatively, the substrate can be fabricated from ceramic materials, such as silicon, alumina, glass, etc.

In Step 102, a component, e.g. a semiconductor device, is provided for packaging. The component can be any device having a solder terminal thereon as, for example, a IC made of at least one semiconductor material and having one of a variety of lead-based or lead-free solder bumps on the IC. The invention also contemplates the packaging of a resistor, capacitor, inductor, transistor, or any other electronic component in need of packaging and having at least one solder terminal. In an embodiment of the present invention, the device is a flip chip die having approximately 500–10,000 97–95 wt % lead/3–5 wt % tin solder bump terminals.

In Step 104, a thin film type die or substrate fluxer, such as a brush or spray fluxer available from ASYMTEX is suitably charged for fluxing operations. Flux is the applied to either the substrate or the semiconductor device by either brushing or spraying the flux onto the appropriate portion of the substrate or device. The amount of applied flux will depend on the size of the device intended to be interconnected on the substrate, the number of terminals on the device, the type of solder employed, the type of flux employed, etc. Flux can be applied to the portion of the substrate or device in need of fluxing as, for example, over the area where a solder interconnection is to be made. Such preselected areas on the substrate is generally referred to in the art as the chip pad area.

In accordance with the present invention, the applied flux is inspected, Step 106, to determine the suitability of the applied flux for subsequent solder reflow. Step 108 indicates a decision point as to whether the applied flux is above a predetermined value such that a reliable interconnection will be formed during reflow or whether the additional flux is needed.

In practicing the invention, the flux is monitored so that if the flux is below a predetermined value on the substrate and/or device, the deficient part is cleaned with a solvent suitable for removing or stripping the insufficiently applied flux (Step 114). It is understood that a insufficient amount of flux includes when no flux has been applied to the part. In Step 114, the part can be cleaned with conventional solvents for removing flux including aromatics, such as xylene, toluene, terpene, etc. and alcohols, such as methalynol, isopropyl alcohol, tetrahydroferrol-2-carbonyl, kyzen alcohol etc. the appropriate solvent or combination of solvents is chosen to clean or strip any flux from the substrate and/or device in response to monitoring the thickness of the applied flux below a predetermined value In Step 110, a conventional pick and place tool is employed to retrieve the component, precisely determine the placement of the component on the substrate and place the aligned component on the substrate. The tool can additionally inspect the solder bumps of the device to insure that the solder bumps have been accurately placed on the flip chip pads of the substrate. Following assembly of the device and substrate, the assembly is heated to reflow the solder forming an electrical interconnection between the parts, Step 112.

Figure 2:
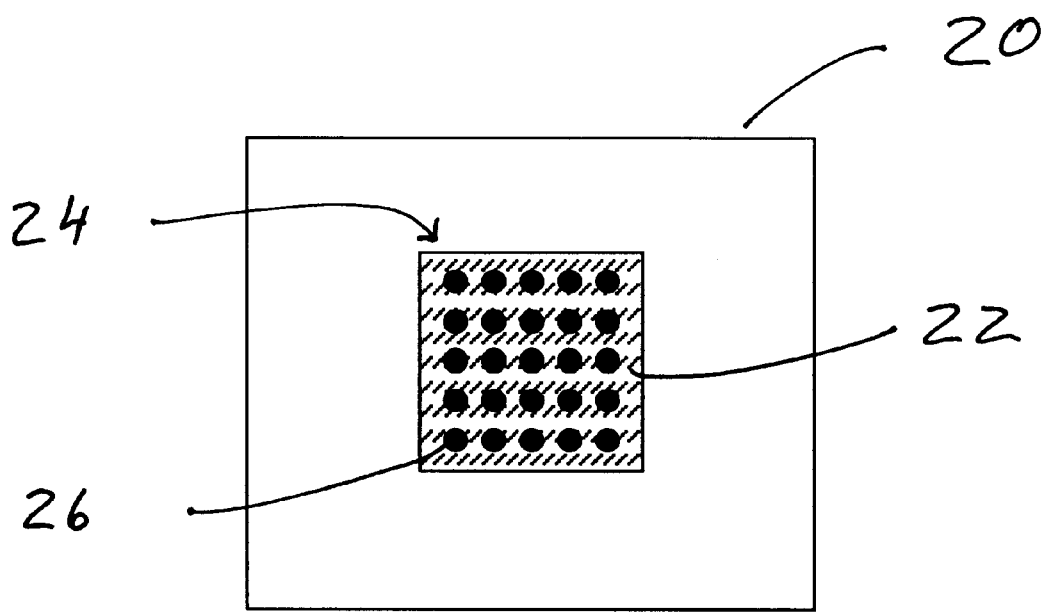
FIG. 2 illustrates a top view of a substrate having applied flux in accordance with the present invention.

In FIG. 2, an embodiment of the present invention is illustrated where ceramic substrate 20 has a thin film of flux 22 in chip pad area 24 over an array of solder pads 26. Suitable fluxes which are particularly useful in the method of the present invention are no-clean flip chip type fluxes, such as a TACFLUX from the Indium Corporation of America, based in Utica, N.Y. In an embodiment of the present invention, a no-clean flux, such as TAC 10 or H208×4 available from Indium Corp., is brushed on the ceramic substrate.

In accordance with the present invention, the applied flux is then inspected. Inspecting the applied flux comprises monitoring the thickness of the applied flux as, for example, by impinging a light on the flux film and detecting the reflected light. The impinging light can be that of a laser, e.g. a He—Ne laser, and the detector can be a photodetector or a photomultiplier tube as, for example, in an interferometer. An interferometer, such as an InspecStep In-situ Interferometer, manufactured by Litel Instruments, Inc. of San Diego, Calif., can be adapted to the present invention.

Figure 3:
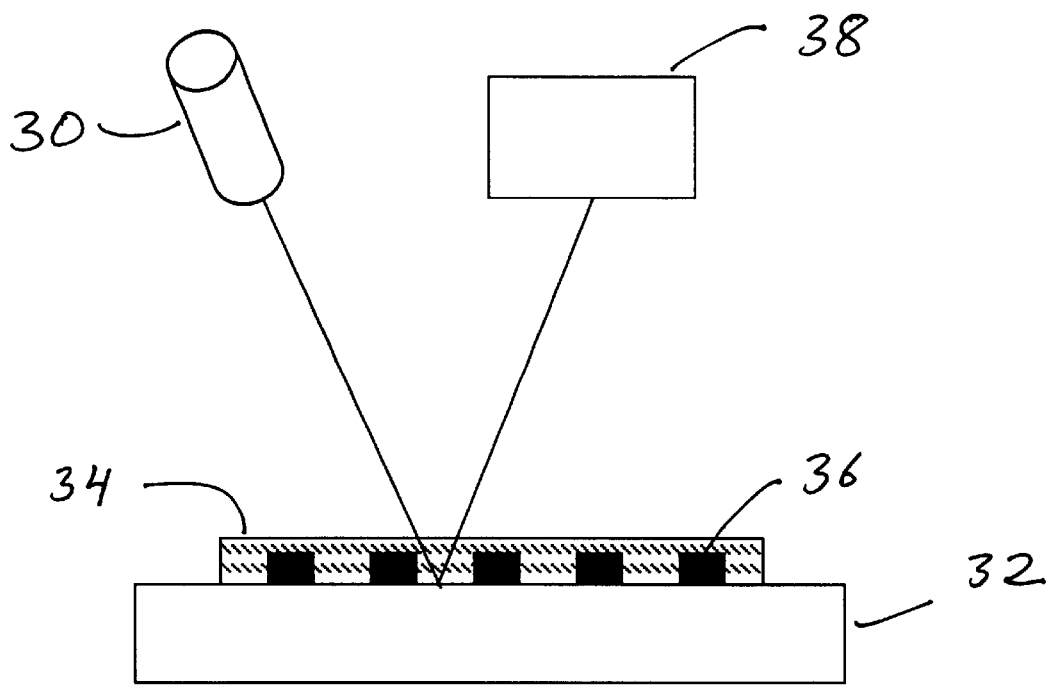
FIG. 3 is a cross-sectional view of a substrate having applied flux in accordance with the present invention.

As illustrated in the embodiment of FIG. 3, light emanating from laser beam 30 is directed to the substrate 32 through a film of applied flux 34 overlaying an array of solder pads 36. The reflected light is detected by photocell 38, e.g. a photomultiplier tube. In an embodiment of the present invention, a laser light of about 1 mm to about 5 mm is focused on the chip area to determine the thickness of the applied flux and its uniformity. It has been discovered that in order for fully assembled integrated circuit chip packages (i.e., fully assembled packages having at least one semiconductor device bonded, attached or mounted thereon) to survive industry testing amd qualification procedures, a flux thickness of from approximately 1.5 mils.+/–0.5 mils, should be employed. By knowing the thickness of the applied flux, its density and area of coverage, the amount of flux can be calculated for a given chip area. In an embodiment of the present invention, the amount of applied flux in the chip area is from about 0.1 mg to about 20 mg.

The present invention contemplates inspecting the applied flux to determine whether the amount of applied is satisfactory for a particular assembly. As discussed above, the amount of flux that will be satisfactory depends on several factors, often requiring emperical determinations. In practicing the present invention, the amount of flux can be determined based on its thickness. Thus, once the satisfactory thickness has been determined for a given assembly, the packaging process can be controlled such that when the thickness of the flux falls below or above predetermined values the process is interrupted and corrected according the steps shown in FIG. 1. In the embodiment of the present invention a H208×4 flux is applied over a ceramic substrate having the thickness in the range of approximately 0.05 to 2 mil prior to mounting a flip chip die.

When the applied flux falls within the predetermined values, the device and substrate are assembled and an electrical interconnection is formed between the device and the substrate by the application of heat, such as by infrared radiation, a flow of dry heated gas, such as in a belt furnace, or a combination thereof, to reflow the solder and interconnect the device and substrate. In an embodiment of the present invention, the assembly is reflowed by a process of heating the organic carrier member from about 220° C. to about 270° C., by a process of a combined infrared/convection heater.

Figure 4:
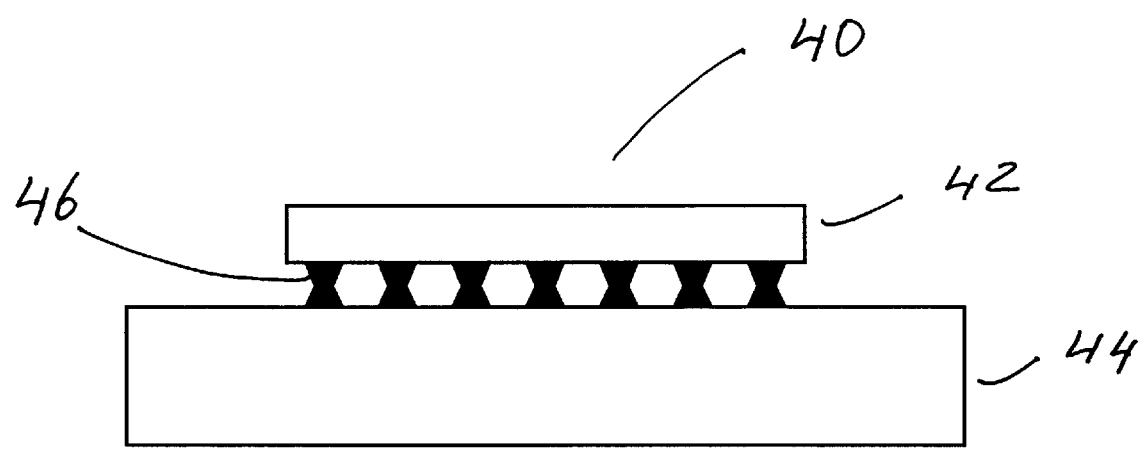
FIG. 4 depicts a cross-sectional view of a device assembly comprising a semiconductor device and a substrate of the present invention.

After reflow, the assembled device/substrate forms an interconnected package. As illustrated in FIG. 4 the interconnected package 40 includes a device, e.g. and IC die 42 mechanically and electrically attached to substrate 44 by a plurality of interconnects 46. The packaged assembly, thus, provides an electrical signal path from IC die 42 through interconnections 46 through substrate 44, to an external circuitry by way of internal wiring (not shown for illustrative convenience). Substrate 44 can be made of ceramic materials, e.g. as in an alumna circuitized substrate, or plastic materials. When the substrate is made of a ceramic, the electrical and mechanical interconnect between the die and substrate is conventionally achieved by reflowing the solder at a relatively high temperature, such as 350° C. to 370° C., to join solder between the die and substrate. It is preferable to have the high melting interconnection on the die to avoid degradation of the die/substrate interconnection in subsequent thermal processing steps.

The process steps and structures described above do not form a complete process flow for manufacturing device assemblies or the packaging of integrated semiconductor devices. The present invention can be practiced in conjunction with electronic package fabrication techniques currently used in the art, and only so much of the commonly practiced process steps are included as are necessary for an understanding of the present invention. The figures representing cross-sections of portions of electronic package fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of monitoring flux application, the method comprising:

applying flux to a substrate or a die to form a flux film having a thickness; and monitoring the thickness of applied flux.

2. The method according to claim 1, comprising monitoring the thickness of applied flux by impinging a light on the applied flux and detecting the reflected light.

3. The method according to claim 1, comprising monitoring the thickness of the applied flux for uniformity.

4. The method according to claim 1, comprising determining the amount the applied flux.

5. The method according to claim 1, comprising monitoring the thickness of the applied flux with a interferometer.

6. The method according to claim 1, comprising applying the flux to a thickness of from about 5 mils to about 0.5 mils.

7. The method according to claim 1, comprising applying a no-clean flux as the applied flux.

8. The method according to claim 1, comprising applying the flux to the substrate.

9. The method according to claim 1, comprising applying a no-clean flux to a ceramic substrate.

10. A method of manufacturing an interconnected device assembly, the method comprising:

providing a substrate having conductive contacts thereon for mounting a device, providing a device having a plurality of solder contacts thereon;

applying a film of flux to the substrate and/or the device;

monitoring the thickness of the applied flux;

mounting the device on the substrate such that the solder contacts of the device are aligned with the conductive contacts on the substrate to form a substrate/device assembly; and forming an electrical connection between the solder contacts of the device and the conductive contacts on the substrate.

11. The method according to claim 10, comprising mounting the device to the substrate in response to monitoring the thickness of the applied flux above a predetermined value.

12. The method according to claim 10, comprising stripping any applied flux and applying flux to the substrate and/or the device in response to monitoring the thickness of the applied flux below a predetermined value.

13. The method according to claim 10, comprising reflowing the plurality of solder contacts on the device by heating the assembly from about 220° C. to about 270° C.

* * * * *